US011386951B2

United States Patent
O'Brien et al.

(10) Patent No.: US 11,386,951 B2
(45) Date of Patent: Jul. 12, 2022

(54) MULTI-LEVEL MAGNETIC TUNNEL JUNCTION (MTJ) DEVICES INCLUDING MOBILE MAGNETIC SKYRMIONS OR FERROMAGNETIC DOMAINS

(71) Applicant: Intel Corporation, Santa Clara, CA (US)

(72) Inventors: Kevin O'Brien, Portland, OR (US); Brian Doyle, Portland, OR (US); Kaan Oguz, Portland, OR (US); Noriyuki Sato, Hillsboro, OR (US); Charles Kuo, Hillsboro, OR (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 831 days.

(21) Appl. No.: 16/022,547

(22) Filed: Jun. 28, 2018

(65) Prior Publication Data

US 2020/0005861 A1 Jan. 2, 2020

(51) Int. Cl.
*G11C 11/56* (2006.01)
*H01L 43/02* (2006.01)
*G11C 11/16* (2006.01)
(Continued)

(52) U.S. Cl.
CPC ........ *G11C 11/5607* (2013.01); *G11C 11/161* (2013.01); *G11C 11/1673* (2013.01);
(Continued)

(58) Field of Classification Search
CPC .............. G11C 11/5607; G11C 11/161; G11C 11/1675; G11C 11/1673; H01L 43/02;
(Continued)

(56) References Cited

U.S. PATENT DOCUMENTS 8,796,797 B2 * 8/2014 Doyle ..................... G11C 11/18
257/421

(56) References Cited

10,720,572 B1 * 7/2020 Fitelson .............. G11C 11/1659
2013/0140513 A1 * 6/2013 Lai ...................... H01L 45/1233
257/E47.001
(Continued)

FOREIGN PATENT DOCUMENTS

JP 2012043913 3/2012
WO 2017151735 9/2017

OTHER PUBLICATIONS

Fert, Albert, et al., "Skyrmions on the track", Nature Nanotechnology, vol. 8, Mar. 2013, 5 pgs.
(Continued)

*Primary Examiner* — Mushfique Siddique
(74) *Attorney, Agent, or Firm* — Essential Patents Group, LLP

(57) ABSTRACT

A MTJ device includes a free (storage) magnet and fixed (reference) magnet between first and second electrodes, and a programmable booster between the free magnet and one of the electrodes. The booster has a magnetic material layer. The booster may further have an interface layer that supports the formation of a skyrmion spin texture, or a stable ferromagnetic domain, within the magnetic material layer. A programming current between two circuit nodes may be employed to set a position of the skyrmion or magnetic domain within the magnetic material layer to be more proximal to, or more distal from, the free magnet. The position of the skyrmion or magnetic domain to the MTJ may modulate TMR ratio of the MTJ device. The TMR ratio modulation may be employed to discern more than two states of the MTJ device. Such a multi-level device may, for example, be employed to store 2 bits/cell.

18 Claims, 10 Drawing Sheets

(51) Int. Cl.
*H01F 10/32* (2006.01)
*H01L 43/10* (2006.01)
*H01L 27/22* (2006.01)
*H01L 43/12* (2006.01)

(52) U.S. Cl.
CPC ........ *G11C 11/1675* (2013.01); *H01F 10/329* (2013.01); *H01F 10/3254* (2013.01); *H01F 10/3272* (2013.01); *H01F 10/3286* (2013.01); *H01L 27/228* (2013.01); *H01L 43/02* (2013.01); *H01L 43/10* (2013.01); *H01L 43/12* (2013.01)

(58) Field of Classification Search
CPC ....... H01L 43/10; H01L 27/228; H01L 43/12; H01L 43/08; H01F 10/3254; H01F 10/329; H01F 10/3286; H01F 10/3272; H01F 41/307
See application file for complete search history.

(56) References Cited

U.S. PATENT DOCUMENTS

| | | | |
|---|---|---|---|
| 2016/0225817 A1* | 8/2016 | Machkaoutsan | H01L 43/08 |
| 2017/0033742 A1* | 2/2017 | Akerman | G11C 11/161 |
| 2017/0178747 A1 | 6/2017 | Tokunaga et al. | |
| 2017/0178748 A1* | 6/2017 | Nagaosa | H01L 27/105 |
| 2018/0047894 A1 | 2/2018 | Pinarbasi et al. | |
| 2018/0301266 A1* | 10/2018 | Ou | H03B 15/006 |
| 2019/0131049 A1* | 5/2019 | Buttner | H01L 43/02 |
| 2019/0206466 A1* | 7/2019 | Schabes | H01F 10/329 |
| 2020/0006628 A1* | 1/2020 | O'Brien | H01L 43/08 |
| 2021/0013397 A1* | 1/2021 | O'Brien | H01L 43/08 |

OTHER PUBLICATIONS

Iwasaki, Junichi, et al., "Universal current-velocity relation of skyrmion motion in chiral magnets", Nature Communications, DOI: 10,1038/ncomms2442, 2013, 8 pgs.

Jabeur, Kotb, et al., "High Performance Spin-Orbit-Torque (SOT) Based Non-volatile Standard Cell for Hybrid CMOS/Magnetic ICs", Computer Science and Information Technology, DOI: 10,13189/csit.2017.050301,2017, 6 pgs.

Kang, Wang, et al., "Skyrmion-Electronics: An Overview and Outlook", Proceedings of the IEEE, vol. 104, No. 10, Oct. 2016, 22 pgs.

Rosch, Achim, "Moving with the current", Nature Nanotechnology, vol. 8, Mar. 2013, 2 pgs.

* cited by examiner

MULTI-LEVEL MAGNETIC TUNNEL JUNCTION (MTJ) DEVICES INCLUDING MOBILE MAGNETIC SKYRMIONS OR FERROMAGNETIC DOMAINS

BACKGROUND

A magnetic tunneling junction (MTJ), typically comprising a fixed magnet (layer or structure) and a free magnet (layer or structure) separated by a tunneling barrier layer, can be switched between states of electrical resistance: a state having a low resistance; and another state with a high resistance. This phenomenon is known as tunneling magnetoresistance (TMR) with higher TMR ratios being advantageous for distinguishing the states. For a structure including two ferromagnetic layers separated by a thin insulating tunnel layer, it is more likely that electrons will tunnel through the tunnel layer when magnetizations of the two magnetic layers are in a parallel orientation than if they are not (e.g., have non-parallel or anti-parallel orientation). As such, various magnetic random access memory (MRAM) devices employing a MTJ have been proposed and are under development. Spin-Transfer Torque Memory (STTM) devices are two terminal non-volatile magnetic memory devices that utilize a MTJ. Spin Orbit Torque (SOT) devices are three terminal non-volatile magnetic memory devices that likewise utilize a MTJ.

In MTJ devices, current-induced magnetization switching may be used to set two bit states of a memory cell. Polarization states of one ferromagnetic layer can be switched relative to a fixed polarization of the second ferromagnetic layer (e.g., via the spin transfer torque phenomenon), enabling two states of the MTJ to be set by application of current. Angular momentum (spin) of the electrons may be polarized through one or more structures and techniques (e.g., direct current, spin-hall effect, etc.). These spin-polarized electrons can transfer their spin angular momentum to the magnetization of the free layer and cause it to precess. As such, the magnetization of the free magnet can be switched, for example by a pulse of current exceeding a certain critical value, while magnetization of the fixed magnet remains unchanged as long as the current pulse is below some higher threshold associated with the fixed magnet architecture.

The resistance state of a MTJ device may be defined by the relative orientation of magnetization of two magnetic layers (fixed and free) that are separated by a tunnel barrier. When the magnetization of the two magnetic layers have orientations that are in the same direction, the device is said to be in a low resistance state. Conversely, when the magnetization of the two magnetic layers have orientations that are in opposite directions, the device is said to be in a high resistance state. Resistance switching may be brought about by passing a critical amount of spin polarized current or switching current through the device so as to influence the orientation of the magnetization of the free magnet to align with the magnetization of the fixed magnet. By changing the direction of the current, the magnetization in the free magnet may be reversed relative to that of the fixed magnet. Since the free magnet does not need power to retain relative orientation of magnetization, the resistance state of the MTJ device may be retained even when there is no power applied to the device.

An increase in the storage density (e.g., bits/cell) for a given MTJ cell size can advantageously increase the capacity of a MTJ memory. Techniques and device architectures that increase the storage density of a MTJ device cell are therefore advantageous.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements. In the figures.

DETAILED DESCRIPTION

Figure 1:
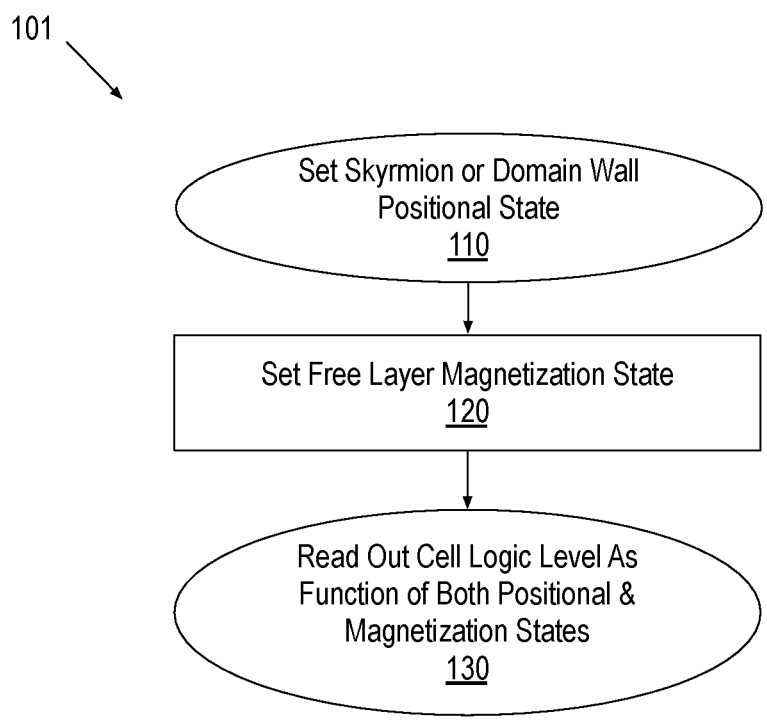
FIG. 1 is a flow diagram illustrating methods of operating a multi-level MTJ device, in accordance with some embodiments.

Magnetic tunneling junction (MTJ) devices (e.g., STT, SOT, etc.) with a "booster" that includes one or more mobile ferromagnetic domains or magnetic skyrmions, methods of operation, and methods of fabrication, are described. In the following description, numerous specific details are set forth, such as exemplary device architectures, to provide a thorough understanding of embodiments of the present disclosure. However, it will be apparent to one skilled in the art, that the present disclosure may be practiced without these specific details. In some instances, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

Certain terminology may also be used in the following description for the purpose of reference only, and thus are not intended to be limiting. For example, terms such as "top," "bottom," "upper", "lower", "over," "above", "under," and "below" refer to directions in the drawings to which reference is made. Terms such as "front", "back", "rear", and "side" describe the orientation and/or location of portions of the component within a consistent but arbitrary frame of reference, which is made clear by reference to the text and the associated drawings describing the component under discussion. Such terminology may include the words specifically mentioned above, derivatives thereof, and words of similar import. The terms "over," "under," "between," and "on" may also be used herein to refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

In some embodiments, a multi-level MTJ device includes a terminal suitable for controlling a state of the MTJ device by positioning a mobile ferromagnetic domain or a mobile magnetic skyrmion spin texture relative to the MTJ. FIG. 1 is a flow diagram illustrating methods 101 for operating a multi-level MTJ device, in accordance with some embodiments. At block 110, a state of a magnetic skyrmion of the MTJ device is set. In some embodiments, a MTJ device includes a booster comprising a magnetic material layer in which there is a magnetic skyrmion texture that is further subject to first programming through an application of an electrical current through the booster. In accordance with some exemplary embodiments, at block 110 a first current pulse is passed between a first pair of electrodes proximal to opposite ends of the booster to translate one or more magnetic skyrmions over a finite length of the booster (e.g., from one physical location to another within the booster). The current pulse driven at block 110 is to control a physical proximity of the magnetic skyrmion to other components of the MTJ device, such as a free magnet. In accordance with some alternative embodiments, the current pulse driven at block 110 between the first pair of electrodes is to translate a ferromagnetic domain wall over some physical length of the booster (e.g., from one physical location to another within the booster), thereby modulating a physical proximity of a magnetic domain to other components of the MTJ device, such as the free magnet.

At block 120, a state of a free magnet of the MTJ device is set. Any suitable technique may be employed at block 120 to define a direction of magnetic anisotropy of the free magnet. In some embodiments, a second current pulse is driven at block 120 between a second pair of electrodes to employ a spin transfer torque (STT) and/or a spin orbit torque (SOT) to induce a magnetic anisotropy of the free magnet to be either parallel or anti-parallel to a magnetic anisotropy of a fixed magnet in the MTJ device.

At block 130 a resistance of the MTJ device is sensed, for example with any circuitry and techniques known to be suitable for determining a resistance state of a MTJ device. In some embodiments, a third current pulse is driven at block 130 to detect a state of the MTJ device based on the TMR effect. A skyrmion spin texture or magnetic domain may modulate, or "boost" by varying degrees, a magnitude of the TMR effect in a MTJ device as a function of proximity between the free magnet and the magnetic domain or skyrmion texture, for example. In one exemplary embodiment, modulation of the TMR effect is leveraged to set multiple device states, or levels, associated with a relative position of a mobile magnetic domain or skyrmion texture within the booster in combination with the orientation of magnetization of a free magnet relative to a fixed magnet of the MTJ device. In some such embodiments, two base logic levels of a MTJ device associated with the magnetization orientation of the free magnet may be coupled with supplemental logic levels associated with two or more positions of a mobile ferromagnetic domain or skyrmion texture within the booster (one position boosting the TMR effect more than the other). Hence, at block 130 one of four logic levels may be read out of the MTJ device as a function of the positional state and magnetization state that were set in blocks 110 and 120, respectively. The supplemental resistance levels may increase memory density of a MTJ device, for example to provide double-bit density (e.g., four resistance states yielding a density of two-bits/cell). Alternatively, the supplemental resistance levels, may be employed for other purposes in a MTJ device having less than double-bit density (e.g., 1 bit/cell).

As described further below, a MTJ device may include at least first, second and third electrodes. A fixed magnet and a free magnet are between the first and second electrodes. A tunnel barrier is between the free magnet and the fixed magnet, and a booster is between the free magnet and one of the first and second electrodes that is on a side of the free magnet opposite the fixed magnet. One portion of the booster is coupled to the third electrode. In some exemplary embodiments, the booster includes a magnetic material that is operable as a conductive nanowire and in contact with a layer of non-magnetic interface material. An interfacial Dzyaloshinskii-Moriya Interaction (DMI) between the magnetic material and the non-magnetic interface material may promote a skyrmion spin texture topology within the booster, for example in the presence of a weak magnetic field. Such a field may result from one or more magnetic layers within a MTJ device, such as, but not limited to, the fixed magnet. Alternatively, a weak magnetic field may originate from a magnetic field source other than the fixed magnet (e.g., fabricated in proximity to the MTJ device). The magnetic skyrmion can be translated from one location to another within the magnetic material through application of an electrical current driven between the third electrode and another circuit node, such as one or more of the first and second electrodes. In alternative embodiments, the booster includes a ferromagnetic material having one or more domain walls, and may further include one or more interface materials that either enhance domain wall formation and/or enhance domain wall mobility within the magnetic material. As has been previously shown for a racetrack memory architecture, a ferromagnetic domain wall can also be translated from one location to another within a magnetic material through application of a drive current, albeit one of significantly larger magnitude than is needed for translating a magnetic skyrmion. Hence, for these embodiments as well, a domain wall within the booster may be driven between the third electrode and another circuit node, such as one or more of the first and second electrodes of a pSTTM device.

Figure 2A:
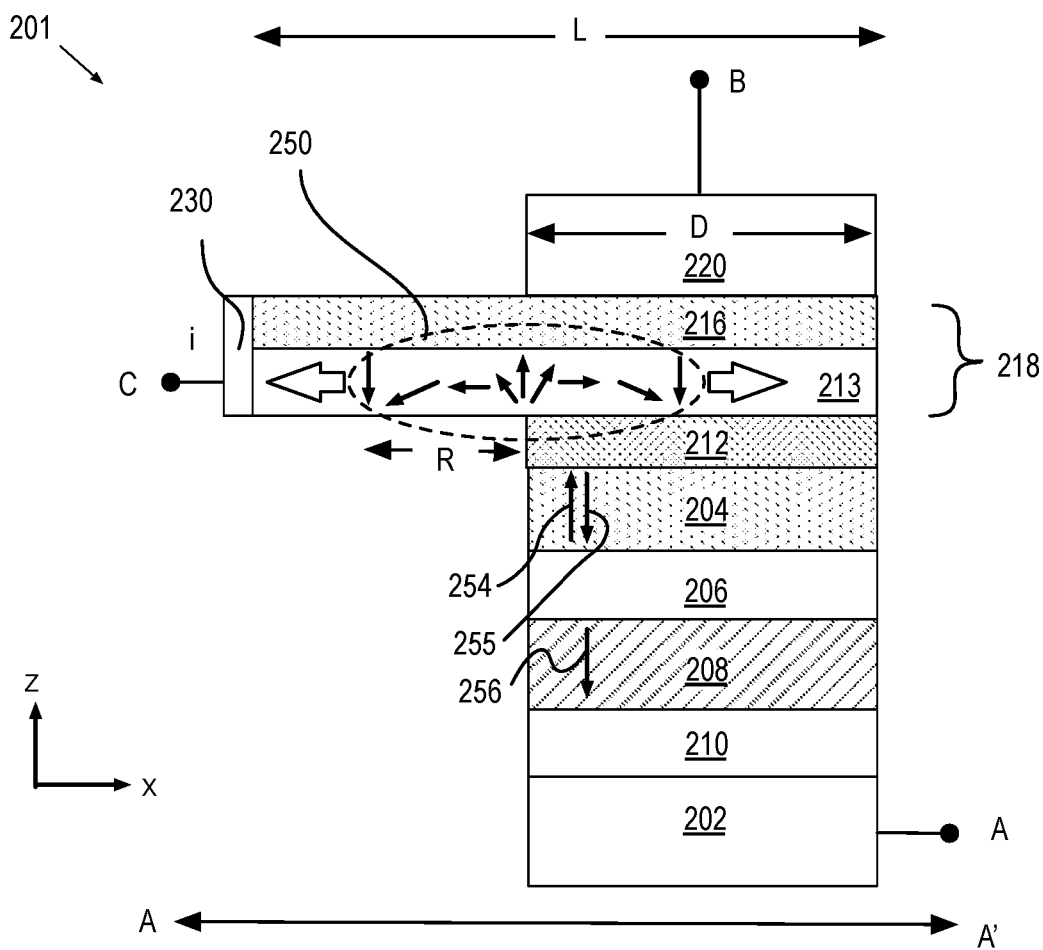
FIG. 2A illustrates a cross-sectional view of a multi-level STTM device, in accordance with some embodiments.

FIG. 2A illustrates a cross-sectional illustration of a pSTTM device 201. Although a pSTTM device is illustrated for the purpose of explanation, programmable booster architectures and/or techniques described in the context of the exemplary pSTTM device may be readily applied to other MTJ devices, such as, but not limited to, SOT devices. As depicted, pSTTM device 201 includes electrodes 202 and 220 and a pSTTM material stack between electrodes 202 and 220. In this example, a free magnet 204 and a fixed magnet 208 are between electrodes 202 and 220. The pSTTM material stack further includes a tunnel barrier 206 between free magnet 204 and fixed magnet 208. The pSTTM material stack further includes a programmable booster 218 that is between free magnet 204 and electrode 220. Booster 218 is therefore on a side of free magnet 204 that is opposite fixed magnet 208. Booster 218 includes a magnetic layer 213. In this example, booster 218 further includes an interface layer 216 between magnetic layer 213 and electrode 220. A coupling layer 212 is between magnetic layer 213 and free magnet 204. Coupling layer 212 is to provide strong direct coupling between magnetic layer 213 and free magnet 204 as stronger direct coupling may enhance the impact of booster 218 on the device TMR ratio. An additional interface layer may be included within a booster structure, for example where coupling layer 212 does not provide a suitable interface to magnetic layer 213. Hence, a booster structure in accordance with embodiments herein may have more than the two material layers illustrated for booster 218. A booster structure could potentially also rely exclusively on magnetic layer 213 (i.e., a single layer booster) if adjacent (e.g., subjacent and superjacent) material layers of the pSTTM material stack provide a suitable interface to magnetic layer 213.

In some exemplary embodiments, magnetic layer 213 comprises a magnetic skyrmion 250. Magnetic layer 213 advantageously has a lateral length L in a first dimension (e.g., x-dimension) that is greater than a lateral dimension of magnetic skyrmion 250 such that magnetic skyrmion 250 may be located in two or more positions along length L. An electrode 230 is in contact with one portion of booster 218, and more specifically is proximal to an end of magnetic material 213 separated from electrode 220 by at least a portion of lateral length L. As described further below, skyrmion 250 is to translate over length L in response to an electrical current i driven between electrode 230 and electrode 220, for example. Hence, electrode 230 may be referred to as a booster programming electrode.

In the illustrative embodiment, interface layer 216 is in contact with magnetic layer 213 over the entire length L. Presence of the interface layer 216 over the entire length L may advantageously maintain skyrmion 250 regardless of its position within magnetic layer 213, avoiding annihilation of skyrmion 250 within length L. Interface layer 216 may be any non-magnetic material that has a suitable spin-orbit coupling effect. A spin orbit interaction at an interface between magnetic layer 213 and the non-magnetic material of interface layer 216 may promote a magnetic skyrmion of a suitable topology (e.g., dimension, texture type, etc.) in magnetic layer 213. Interface layer 216 may have a spin-orbit coupling effect of a particular sign (e.g., "+", or "−") that promotes a particular spin canting within magnetic layer 213. The DMI at the interface of magnetic layer 213 and interface layer 216 may be a significant factor in determining the spin topology (i.e., skyrmion texture) within magnetic layer 213. If significant enough, the spin-orbit coupling effect of a single interface layer may be sufficient for the formation of a magnetic skyrmion in magnetic layer 213 of a desired topology (e.g., dimension, texture type, etc.). Otherwise, another interface layer (not depicted) on the other side of magnetic layer 213 may be further included in booster 218 to reinforce the effect of interface layer 216. Like interface layer 216, an additional interface layer may have substantially the same length L as magnetic layer 213. Although STTM device 201 is illustrated for the example of a skyrmion spin texture, skyrmion 250 may instead represent a magnetic domain for embodiments where interface layer 216 instead supports stable ferromagnetic domains within magnetic material 213.

In FIG. 2A, orientations of statistically dominant spin states are depicted as arrows over a diameter of skyrmion 250 to illustrate the spin texture topology. In some embodiments, skyrmion 250 has a Neel-type magnetic skyrmion topology where an average local magnetization depicted by the magnetization states varies monotonically between perpendicular and in-plane over radius r. As shown, the magnetization state at a core of the magnetic skyrmion 250 is perpendicular to a plane of magnetic layer 213 and in a first direction (e.g., "up"). For a Neel-type texture, annular regions about the core have in-plane magnetic anisotropy oriented radially away from the core. In other embodiments, skyrmion 250 has Bloch-type spin texture topology. Such a vortex topology may also have magnetization states that vary monotonically between perpendicular and in-plane over radius r. Block-type spin texture topologies may have a first or second polarity, and a first or second chirality, or handedness (e.g., clockwise or counter-clockwise vortex). For Bloch-type texture, a core region again has a first perpendicular magnetic anisotropy within magnetic layer 213. An annular region surrounding the core has an in-plane magnetic anisotropy with clockwise or counter-clockwise chirality until again having perpendicular anisotropy that is antiparallel to the perpendicular magnetic anisotropy of the core region.

In the example illustrated in FIG. 2A, magnetic skyrmion 250 has a radius r, and lateral length L is significantly greater than the diameter of skyrmion 250 (i.e., L>2r). Hence, magnetic skyrmion 250 resides in only a portion of magnetic layer 213. As further shown in FIG. 2A, a first portion of magnetic layer 213 is within the pSTTM device stack, while a second portion of magnetic layer 213 extends beyond an edge of the pSTTM device stack (e.g., beyond a sidewall of free magnet 204). Electrode 220, for example, has a lateral length D in the first dimension (e.g., x-dimension), which is smaller than magnetic layer length L (i.e., D<L). Free magnet 204, may also have a lateral length of approximately D (e.g., slightly larger if the pSTTM device stack has a positive sidewall slope, and slightly smaller if the pSTTM device stack has a negative sidewall slope).

Figure 2B:
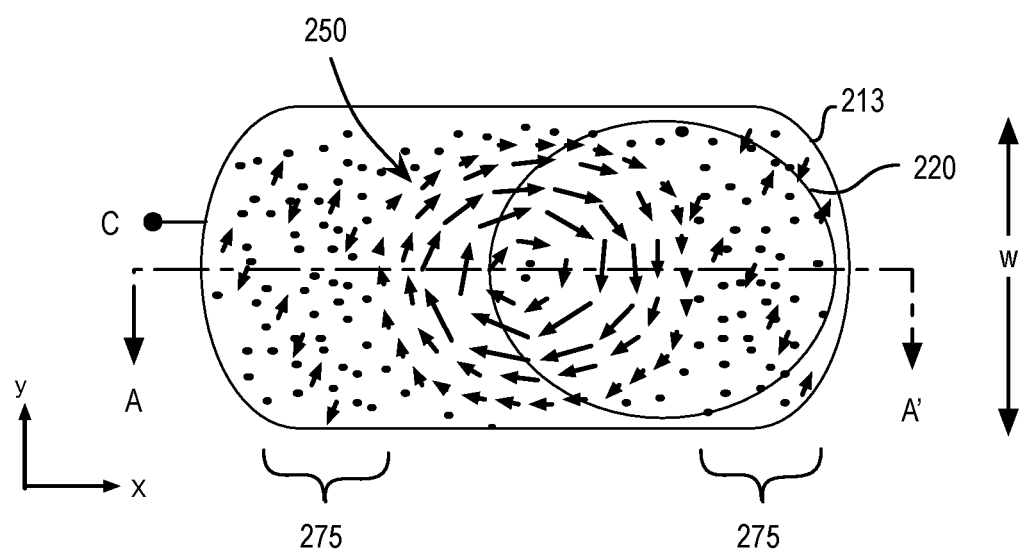
FIG. 2B illustrates a plan view of the multi-level STTM device illustrated in FIG. 1, in accordance with some embodiments.

In some embodiments, magnetic layer 213 has a length L sufficient for magnetic skyrmion 250 to be located either proximal to free magnet 204 (e.g., within a portion of length L that overlaps with length D) or located distal from free magnet 204 (e.g., within a portion of length L beyond length D). TMR modulation may occur in response to a shuttling of magnetic skyrmion 250 between these first and second positions. FIG. 2B further illustrates a plan view where a perimeter of magnetic layer 213 is shown relative to a perimeter of electrode 220. Electrode 220 may have, for example, an area or footprint approximately equal to an underlying MTJ device. As shown, magnetic layer 213 has a larger area that of electrode 220 and may have some magnetic texture 275 within regions beyond the footprint of magnetic skyrmion 250, which in this example has an area approximately equal to that of electrode 220. The lateral dimension of magnetic skyrmion 250 may vary, however (e.g., to have an area larger or smaller than that of electrode 220).

FIG. 3A-3D illustrate cross-sectional views of pSTTM device 201 with skyrmion 250 in one of two positions, each associated one of four resistances. These resistances may be associated with separate logic levels, in accordance with some embodiments of a multi-level MTJ device.

Figure 3A:
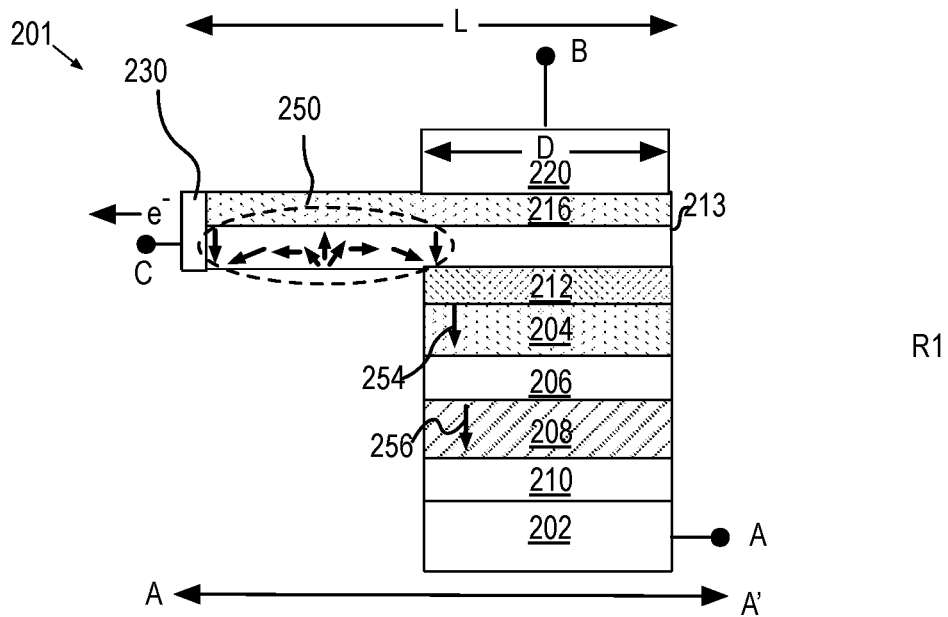
FIGS. 3A, 3B, 3C, and 3D illustrate cross-sectional views of a multi-level STTM device in one of four resistance states, in accordance with some embodiments.

FIG. 3A illustrates a first MTJ state associated with an electrical resistance R1 in which skyrmion 250 is located within a portion of length L that is beyond, or does not overlap, electrode lateral length D. Depending on the magnetic material length L relative to the dimension of skyrmion 250, more or less of skyrmion 250 may reside between free magnet 204 and electrode 220 when skyrmion 250 is in the first position distal from free magnet 204. In some embodiments, magnetic layer 213 has a lateral length L that is at least equal to electrode lateral length D summed with skyrmion radius r. In some further embodiments, magnetic layer 213 has a lateral length L that is at least equal to electrode lateral length D summed with a diameter of skyrmion 250 (e.g., L>D+2r). For such embodiments, skyrmion 250 may be completely outside of the pSTTM device stack while in the first position. For resistance R1, orientation of magnetization 254 of free magnet 204 is predominantly parallel to the orientation of magnetization 256 of fixed magnet 208 (e.g., both up or both down). Resistance R1 may be a lowest resistance of pSTTM device 201, for example, and associated with a first TMR ratio particular to the pSTTM material stack. To enter the MTJ state having resistance R1, a current pulse may be driven in a first direction between circuit nodes B and C (e.g., electrons transit through magnetic material 213 from circuit node B toward circuit node C). Following the skyrmion positional programming current pulse, skyrmion 250 may remain in the first position distal from free magnet 204 (e.g., a non-volatile positional state) until reprogrammed.

Figure 3B:
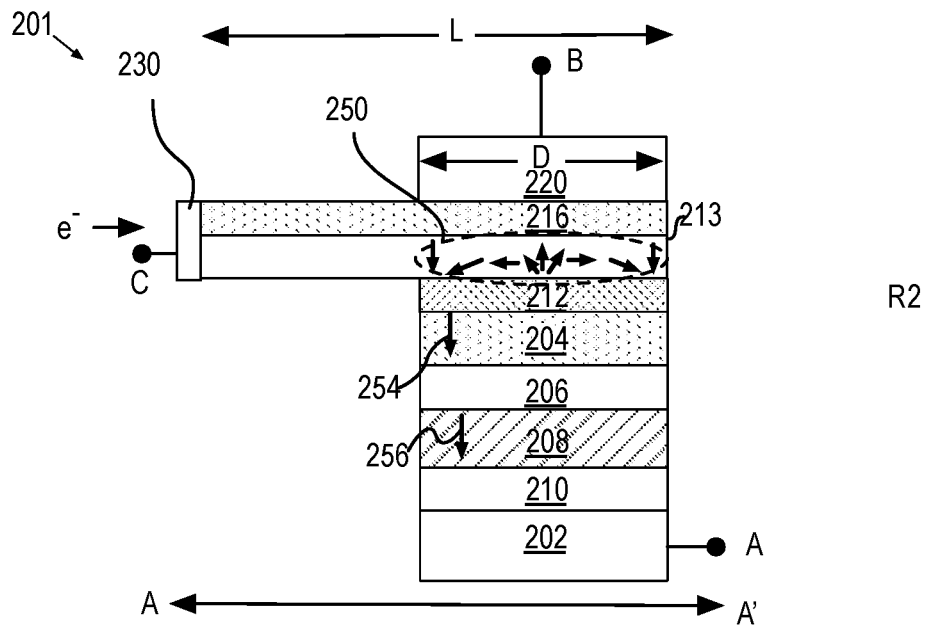

FIG. 3B illustrates a second MTJ state associated with a resistance R2 in which skyrmion 250 is in a second position within a portion of length L that overlaps with electrode lateral length D. Depending on the length D relative to the size of skyrmion 250, more or less of skyrmion 250 may reside between free magnet 204 and electrode 220 when skyrmion 250 is in this second position proximal to free magnet 204. Hence, in some embodiments where the electrode lateral length D is approximately equal to the diameter of skyrmion 250 (i.e., D>2r), skyrmion 250 may be positioned completely within pSTTM device stack, as shown in FIG. 3B. In further embodiments where the electrode lateral length D is not much greater than the diameter of skyrmion 250 (e.g., D≅2R), nearly the entire area of free magnet 204 may overlap with the magnetic field texture of skyrmion 250. In the MTJ state having resistance state R2, the orientation of magnetization 254 of free magnet 204 is again predominantly parallel to an orientation of magnetization 256 of fixed magnet 208. However, this MTJ state may be associated with a second TMR ratio that is lower than the first TMR ratio. For example, the presence of skyrmion 250 may induce canting within free magnet 204 that is absent when skyrmion 250 is distal from free magnet 204. Hence, resistance R2 may be higher than resistance R1. Notably, the relative resistance between the skyrmion's positional states is a function of whether TMR is boosted or degraded more or less by texture of the skyrmion or texture of magnetic layer 213 beyond the skyrmion. So, it is conceivable that resistance R2 could be made to be lower than resistance R1.

To enter the MTJ state with resistance R2, a current pulse may be driven in a second direction between circuit nodes B and C (e.g., electrons transit through magnetic layer 213 from node C toward node B). Following the skyrmion positional programming current pulse, skyrmion 250 may remain in the second position proximal to free magnet 204 with resistance state R2 maintained indefinitely. For embodiments where an entire area of free magnet 204 overlaps with magnetic field texture of skyrmion 250 in the second position, and all of skyrmion 250 resides beyond an edge of free magnet 204 in the first position, the displacement of skyrmion 250 may induce maximum modulation of the TMR ratio of pSTTM device 201. Of course, displacements of lesser degree may also offer TMR modulation sufficient for multi-level memory cell operation.

Figure 3C:
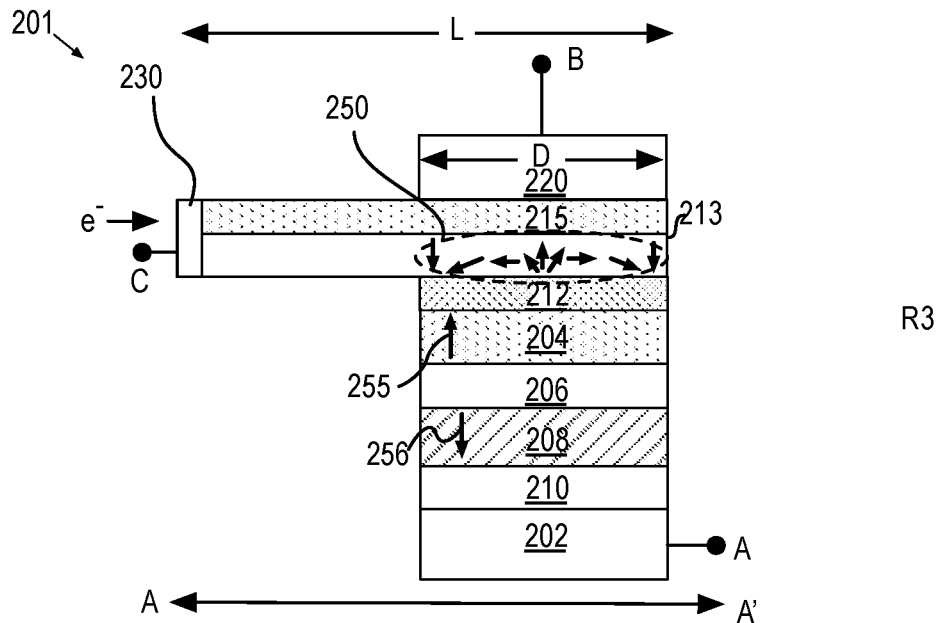

FIG. 3C illustrates a third MTJ state associated with an electrical resistance R3 in which skyrmion 250 is located within a portion of length L that is within, or overlaps, electrode lateral length D. Hence, skyrmion 250 is in substantially the same position or location within magnetic layer 213 as it was for the second MTJ state associated with electrical resistance R2. However, for resistance R3 free magnet 204 has a magnetization orientation 255 that is predominantly anti-parallel to the magnetization orientation 256 (of fixed magnet 208). Resistance R3 may therefore be a higher resistance state of pSTTM device 201 associated with the second TMR ratio achievable by the pSTTM material stack while skyrmion 250 is proximal to free magnet 204. To enter the MTJ state having resistance R3, a current pulse may be driven in between circuit nodes A and B to induce the desired magnetization orientations in free magnet 204. Following the free magnet programming current pulse, free magnet 204 may maintain magnetization orientation 255 indefinitely (e.g., a non-volatile state of magnetic anisotropy).

Figure 3D:
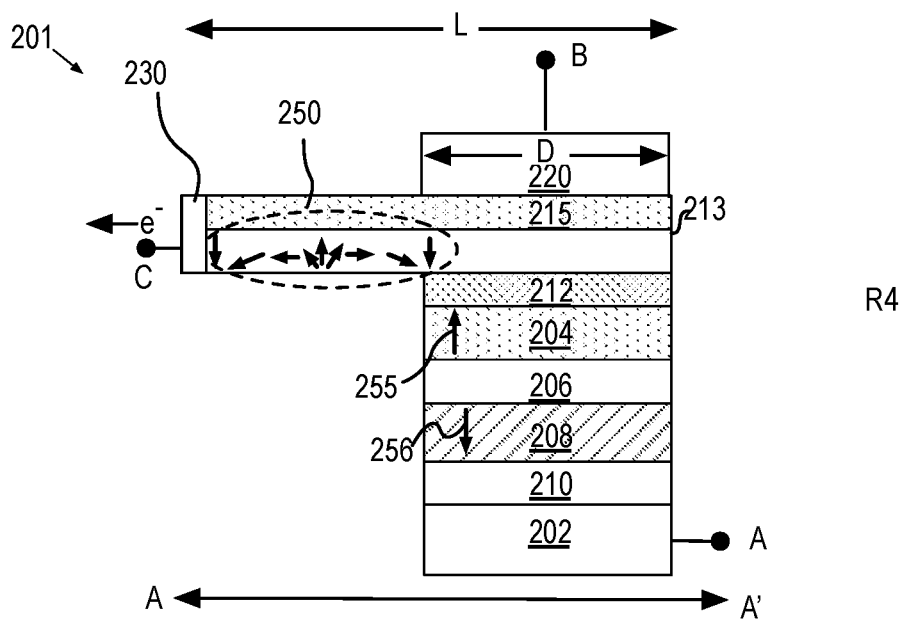

FIG. 3D illustrates a third MTJ state associated with an electrical resistance R4 in which skyrmion 250 is located within a portion of length L that is beyond, or overlaps, electrode lateral length D. Hence, skyrmion 250 is in substantially the same position or location within magnetic layer 213 as it was for the first MTJ state associated with electrical resistance R1. However, for resistance R4 free magnet 204 has a magnetization orientation 255 that is predominantly anti-parallel to the magnetization orientation 256 (of fixed magnet 208). Resistance R4 may therefore be a higher resistance state of pSTTM device 201 associated with the first TMR ratio achievable by the pSTTM material stack while skyrmion 250 is distal from free magnet 204. To enter the MTJ state having resistance R4, a current pulse may be driven in between circuit nodes A and B to induce the desired magnetization orientation in free magnet 204. Following the free magnet programming current pulse, free magnet 204 may maintain magnetization orientation 255 indefinitely (e.g., a non-volatile state of magnetic anisotropy).

As noted above, in alternative embodiments, domain wall mobility may be similarly leveraged to modulate the TMR ratio of a pSTTM stack. For such embodiments, a first domain having a first orientation, for example parallel to magnetic orientation 254 (e.g., FIG. 3A or 3B), may be adjacent to a second domain having a second orientation, for example anti-parallel to magnetic orientation 255. Domain wall movement induced through one or more mechanism (e.g., spin orbit torque, spin-transfer torque, etc.) associated with a drive current between circuit nodes B and C may position one or the other of the first and second magnetic domains proximal to free magnet 204. A low resistance level may be achieved where the first domain, parallel to magnetic orientation 254, is positioned to couple strongly with free magnet 204 while free magnet 204 has magnetic orientation 255. In this state, the TMR ratio may be boosted. A next resistance level may be achieved where the second domain, anti-parallel to magnetic orientation 254, is positioned to couple strongly with free magnet 204 while free magnet has magnetic orientation 255. In this state, the TMR ratio is unboosted, or degraded. A third resistance level may be achieved where the first domain, parallel to magnetic orientation 254, is positioned to couple strongly with free magnet 204 while free magnet 204 has magnetic orientation 255. A fourth resistance level is achieved where the second domain, anti-parallel to magnetic orientation 254, is positioned to couple strongly with free magnet 204 while free magnet 204 has magnetic orientation 255.

Magnetic layer 213 may comprise a magnetic material having any composition known to be suitable for forming a magnetic skyrmion or magnetic domains of sufficient stability. In some skyrmion-based embodiments, magnetic layer 213 comprises a chiral lattice magnet. In some exemplary embodiments, magnetic layer 213 includes one or more of iron, cobalt, nickel or manganese. Magnetic layer 213 may be iron, an alloy of iron (e.g., predominantly iron), cobalt, an alloy of cobalt (e.g., predominantly cobalt), an alloy including both iron and cobalt, an alloy of nickel that may further include one or more iron and cobalt, or an alloy of manganese that may optionally further include one or more of iron, cobalt, or nickel. In some exemplary iron alloy embodiments, magnetic layer 213 includes iron and at least one of iridium, aluminum, silicon, or germanium. In some exemplary manganese embodiments, magnetic layer 213 includes manganese and silicon. Magnetic layer 213 may have a thickness in the range of 0.9 nm-4 nm, for example, and in some advantageous iron alloy embodiments magnetic layer 213 has a thickness less than 2 nm.

In some embodiments, interface layer 216 includes at least one of silicon, aluminum, platinum, iridium, tungsten, tantalum, or ruthenium. In some embodiments where magnetic layer 213 comprises Fe or Mn, an interface layer 216 comprising iridium (e.g., predominantly iridium) may be advantageous for promoting skyrmion spin texture topologies while an interface layer 216 comprising tantalum (e.g., predominantly tantalum) may be advantageous for promoting stable domain walls. In some other embodiments where magnetic layer 213 comprises Fe or Co, an interface layer 216 comprising tungsten (e.g., predominantly tungsten) may also be suitable for promoting skyrmion spin texture topologies within magnetic layer 213, for example. Depending on the material(s) selected, interface layer 216 may advantageously have a thickness between 0.9 nm-4 nm.

In some embodiments, coupling layer 212 includes at least one of ruthenium, tungsten, tantalum or iridium. In some embodiments where magnetic layer 213 comprises Fe or Mn, coupling layer 212 comprises tungsten (e.g., predominantly tungsten). In some other embodiments where magnetic layer 213 comprises Fe or Mn, coupling layer 212 comprises tantalum (e.g., predominantly tantalum) or ruthenium (e.g., predominantly ruthenium). Depending on materials selected, coupling layer 212 may advantageously have a thickness less than 2 nm (e.g., between 0.9 nm-1.5 nm). As noted above, where coupling layer 212 does not provide an interface to magnetic layer 213 favorable for the skyrmion spin texture topologies (or stable ferromagnetic domains), another interface layer may be intervening between coupling layer 212 and magnetic layer 213. Such an interface layer may, for example, have any of the compositions described above for interface layer 216, and in some embodiments has the same composition as interface layer 216. In other embodiments where coupling layer 212 provides a suitable interface to magnetic layer 213, coupling layer 212 may optionally extend over the entire magnetic layer length L, substantially as illustrated for interface layer 216.

In some embodiments, fixed magnet 208 includes one or more material layers and has a thickness sufficient for maintaining a fixed magnetization. For example, fixed magnet 208 may include an alloy such as CoFe, FeB, or CoFeB. In some embodiments, fixed magnet 208 includes $Co_{100-x-y}Fe_xB_y$, where X and Y each represent atomic percentages. In some exemplary embodiments, X is in the range of 50-80, and Y is in the range of 10-40, and the sum of X and Y is less than 100. In one specific embodiment, X is 60 and Y is 20. In another embodiment, fixed magnet 208 is FeB, where the concentration of boron is between 10-40 atomic percent of the total composition of the FeB alloy. While the thickness of fixed magnet 208 may vary, in an embodiment where the fixed magnet 208 is a single layer of an Fe alloy (e.g., CoFeB, or FeB), fixed magnet 208 has a thickness between 1 nm and 2.5 nm. Tunnel barrier 206 may comprise any material suitable for discriminating electron current base on electron spin. Tunnel barrier 206 (or spin filter layer) may also be referred to as a tunneling layer for electron current of a particular spin orientation. In an embodiment, tunnel barrier 206 includes a material such as, but not limited to, magnesium oxide (MgO) or aluminum oxide (e.g., $Al_2O_3$). In some embodiments, tunnel barrier 206 including an MgO material has an out-of-plane crystal orientation (texture) that is (001) and is lattice matched to free magnet 204 below the tunnel barrier 206 and lattice matched to fixed magnet 208 above tunnel barrier 206. In one example, the tunnel barrier 206 is MgO and has a thickness in the range of 1 nm to 2 nm.

Free magnet 204 may include one or more material layers. In some embodiments, free magnet 204 includes a magnetic material such as Co, Ni, Fe or alloys of these materials. In an embodiment, free magnet 204 includes a magnetic material such as FeB, CoFe or CoFeB. In some embodiments, free magnet 204 comprises $Co_{100-x-y}Fe_xB_y$, where X is in the range 50-80 and Y is in the range of 10-40, and the sum of X and Y is less than 100. In one exemplary embodiment, X is 60 and Y is 20. In another embodiment, free magnet 204 comprises FeB, where the concentration of boron is between 10-40 atomic percent of the total composition of the FeB alloy. The thickness of free magnet 204 may vary, however in some examples free magnet 204 has a thickness that is in the range of 1 nm-2.5 nm.

Spacer 210 may include one or more material layers. In some embodiments, spacer 210 includes a non-magnetic material. Spacer 210 may serve as an enhancement or template layer that improves crystallinity and/or crystal texture of free magnet 204, for example. In some embodiments, spacer 210 has an out-of-plane crystal orientation that is (001) and is lattice matched to free magnet 204. In some embodiments, spacer 210 comprises MGO. Spacer 210 may advantageously have a thickness less than tunnel barrier 206. In some embodiments, spacer 210 has a thickness less than 1.5 nm.

Electrode 202 may include one or more material layers. In some embodiments electrode 202 comprises an amorphous conductive layer. In some embodiments, electrode 202 includes predominantly one of W, Ta, TaN or TiN. In another embodiment, electrode 202 includes one or more Ru layers interleaved with one or more Ta layers. The thickness of electrode 202 may vary, but in some examples electrode 202 has a thickness in the range of 20 nm-50 nm. Electrode 220 may likewise include one or more material layers. In some embodiments, electrode 220 includes predominantly one of W, Ta, TaN or TiN. In some embodiments, electrode 202 and electrode 220 are the same metal (e.g., both Ta or TiN). The thickness of electrode 220 may also vary, however in some examples electrode 220 has a thickness that is in the range of 7 to 70 nm.

Notably, MTJ devices in accordance with embodiments herein may have layer architectures other than that illustrated for pSTTM device 201. For example, a synthetic antiferromagnetic SAF structure may be inserted between fixed magnet 208 and spacer 210. Material layers illustrated for pSTTM device 201 may also be inverted from the ordering shown in FIG. 2A-3D. MTJ devices in accordance with embodiments herein may also be arrayed with various electrodes of individual ones of the MTJ devices coupled together. For example, FIG. 4 illustrates cross-sectional view of an MTJ device array 402 including pSTTM devices 201A and 201B.

Figure 4:
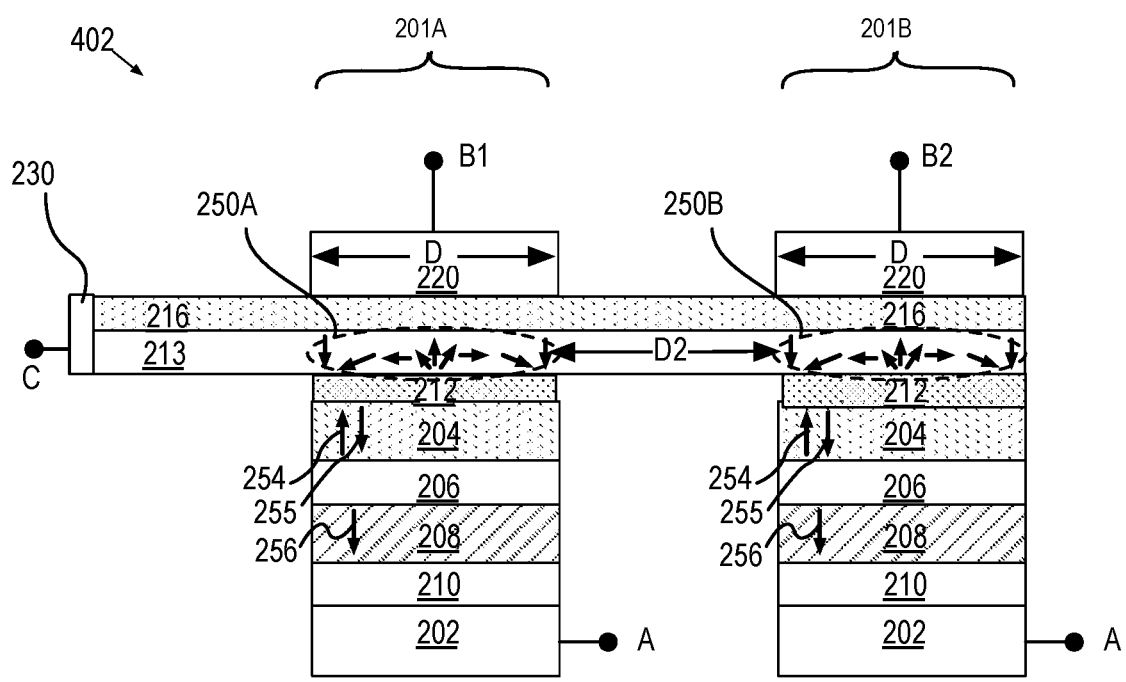
FIG. 4 illustrates a cross-sectional view of a plurality of multi-level STTM devices coupled to a single skyrmion programming electrode, in accordance with some embodiments.

Material layers illustrated in FIG. 4 having the same reference number as in FIG. 2A-3D may have any or all of the properties described above in the context of FIG. 2A-3D. As further shown in FIG. 4, multiple MTJ devices 201A and 201B share a same magnetic material layer 213, which in the illustrated example comprises a skyrmion crystal with a first skyrmion 250A spaced apart from a second skyrmion 250B by a skyrmion lattice length D2. Interface layer 216 also extends between multiple MTJ devices 201A and 201B. Within magnetic layer 213, an arbitrary spin texture may exist between skyrmions 250A and 250B. Skyrmions 250A and 250B may be positioned concurrently relative to MTJ devices 201A and 201B to set a state in both devices. For example, where the pitch of the skyrmion crystal is approximately equal to the pitch of devices 201A and 201B, a programming pulse between circuit nodes C and B2 may induce both skyrmions 250A and 250B to move concurrently between a first position distal from free magnets 204, and a second position proximal to free magnets 204. Other arrayed MTJ device architectures are also possible. For example, devices 201A and 201B may each have an electrically independent booster programming electrode 230 coupled to an independent magnetic layer 213.

The device architectures described herein may be fabricated according to a variety of methods and techniques. For example, any workpiece known to be suitable for semiconductor device manufacture, such as, but not limited to material wafers or panels, may be employed in the fabrication of a multi-level MTJ device. The workpiece received may include a conductive interconnect at least partially embedded within a dielectric layer. In some embodiments, the workpiece includes one or more CMOS circuits. In some such embodiments, the one or more CMOS circuits includes an access transistor coupled to one end of the conductive interconnect.

Figure 5A:
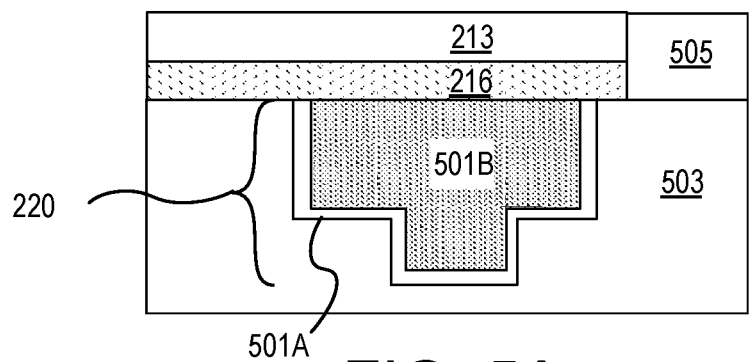
FIGS. 5A, 5B, and 5C illustrate cross-sectional views of a multi-level STTM device evolving as operations in a fabrication method are performed, in accordance with some embodiments.
Figure 5B:
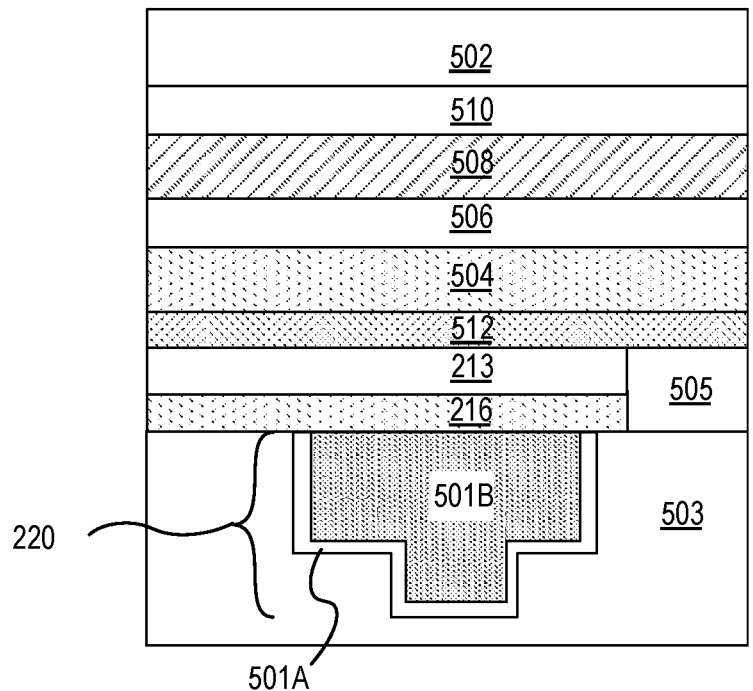
Figure 5C:
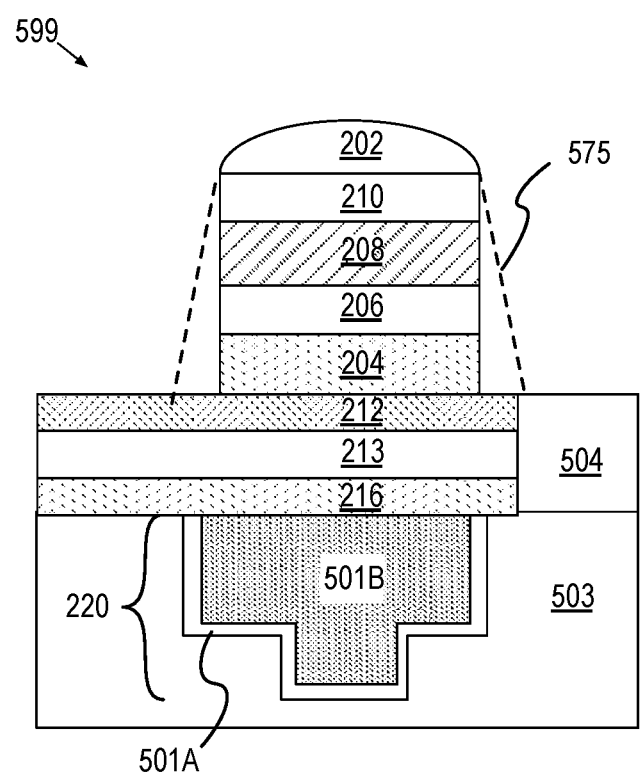

FIG. 5A-5C illustrate a cross-section view of a pSTTM device evolving as selected fabrication operations are performed, in accordance with one or more embodiments. FIG. 5A illustrates a cross-sectional view of electrode 220 as part of a conductive interconnect. In FIG. 5A, electrode 220 is surrounded by a dielectric layer 503 that is over or above a substrate (not depicted). In some embodiments, electrode 220 is electrically connected to a circuit element such as a transistor (not shown). In an embodiment, the electrode material is deposited using a physical vapor deposition (PVD) process or a plasma enhanced chemical vapor deposition (PECVD) process. In an embodiment, the PVD process is an RF or a DC sputtering process. Electrode material may be first blanket deposited and subsequently planarized, for example. In some embodiments, electrode 220 includes a barrier layer 501A, comprising predominantly tantalum or ruthenium, for example. A fill metal 501B, such as any of the electrode materials described above is in contact with barrier layer 501A. In an embodiment, dielectric layer 503 comprises silicon (e.g., silicon dioxide, silicon nitride, silicon carbide, or carbon doped silicon oxide). The dielectric layer 503 may have an uppermost surface that is substantially planar with an uppermost surface of electrode 220, as illustrated. In some examples, the dielectric layer 503 has a total thickness between 70 nm-300 nm.

With a first electrode formed, a booster may be fabricated. For example, in FIG. 5A, interface layer 216 and magnetic layer 213 is deposited over electrode 220. In an embodiment, the material layers 216 and 213 are deposited using PVD or PECVD processes. In an embodiment, at least one of material layers 216 and 213 are deposited with an RF or a DC sputtering process. Material layers 216 and 213 may be first blanket deposited and subsequently planarized, for example, with a top surface of a dielectric feature 505, which has been deposited over dielectric layer 503 and patterned. Dielectric feature 505 may have any of the compositions described above for dielectric layer 503, for example. Alternatively, material layers 216 and 213 may have been patterned and dielectric feature 505 formed by deposition and planarization (e.g., with a spin-coat process) to a top surface of magnetic material 213.

Following formation of the booster, any suitable MTJ layers (e.g., a free magnet, fixed magnet, tunnel barrier) may be deposited over (e.g., on) the booster. In some embodiments represented by FIG. 5B, a layer of coupling material 512 is deposited over (e.g., on) the magnetic layer 213, a free magnet layer 503 is deposited over (e.g., on) the layer of coupling material 512, a layer of tunnel barrier material 506 is deposited over (e.g., on) free magnet layer 503, a fixed magnet layer 508 is deposited over (e.g., on) the layer of tunnel barrier material 506, a layer of spacer material 510 is deposited over (e.g., on) a fixed magnet layer 508, and another layer of electrode material 502 is formed over (e.g., on) the fixed magnet layer 508. Magnetic layers may be blanket deposited using a PVD process, for example. In some embodiments where free magnetic layer 504 includes Co or an alloy of Co (e.g., CoB, CoFe or CoFeB and an alloy of iron such as FeB), the deposition process is carried out at room temperature. In some such embodiments, free magnet and fixed magnetic layers are deposited with a co-sputter deposition process in a PVD chamber. In some embodiments where tunnel barrier material is MgO, the MgO is RF sputtered from a MgO target. In some embodiments where barrier material is MgO, the MgO is formed by a reactive oxidation of a DC-sputtered magnesium film.

Following deposition of the device material layers, an anneal may be performed under any conditions known to be suitable for promoting solid phase epitaxy of one or more material layers within the device material stack. For example, solid phase epitaxy may occur in free magnetic layer 504 following a template of a (nano)crystalline structure within the layer of tunnel barrier material 506 and/or spacer material 510. A thermal anneal of the material layer stack may, for example, be conducted in a furnace at a temperature between 300-400° C. In an embodiment, the anneal is performed post deposition, but prior patterning of the material layer stack into a device. During such an anneal one or more material layers may preferentially crystallize (e.g., tunnel barrier layer 506 and/or layer of spacer material 510) early in the anneal process and serve as a template later in the anneal process. In some embodiments, the annealing process is performed with the workpiece in the presence of an external magnetic field that is to set the magnetization direction of one or more magnetic material layers. For example, the external magnetic field may set magnetization in fixed magnetic layer 508, and/or in free magnetic layer 504. An external magnetic field that is directly parallel to a vertical axis of the material layer stack during the annealing process may promote PMA in fixed magnetic layer 508 and in free magnetic layer 504.

The material stack deposited over the booster may be patterned into one or more devices, for example with one or more etch processes. Any suitable backend processing may then be performed to couple one or more of the device electrodes into a memory circuit according to any techniques known in the art. FIG. 5C illustrates the structure shown in FIG. 5B following formation of a mask (not depicted) and patterning of the MTJ device material layer stack. Depending on embodiments, the width of the mask may have a lateral length D that varies in the range of 10 nm-30 nm. Following patterning of the device material layer stack, the resulting pSTTM device may have any or all of the features described above. In one embodiment, the device material layer stack is etched by a plasma etch process, clearing each of the material layers 504, 506, 508, 510 and 502 to expose the underlying dielectric feature 505 and magnetic layer 213 and arrive at pSTTM device 599, which includes the same material layers introduced in the context of pSTTM device 201, albeit inverted for the sake of illustrating another exemplary structure. In some embodiments, the MTJ device etch process consumes the etch mask, and may also consume a portion of electrode 202. Depending on the plasma etch parameters, pSTTM device 599 may have a sidewall angle that is tapered (indicated by dashed lines 575).

In some embodiments, a dielectric encapsulant layer (not depicted) is formed over, or adjacent to, a sidewall of pSTTM device 599. In some embodiments, a dielectric encapsulant layer is blanket deposited over pSTTM device 599, and on an uppermost surface of dielectric layer 504. In an embodiment, the dielectric encapsulant layer comprises silicon and is advantageously substantially free of oxygen (e.g., silicon nitride or carbon doped silicon nitride). The dielectric encapsulant layer may then be pattern etched to remain only over individual pSTTM devices. In some further embodiments, an anneal process is performed after formation of pSTTM device 599 and after deposition of the dielectric encapsulant layer. In some such embodiments, the anneal process is conducted at an elevated temperature of at least 300° C. The anneal temperature may also be limited to less than 500° C. Such an anneal may promote crystallization at a sidewall of one or more material layers within pSTTM device 599 (e.g., tunnel barrier 206). The anneal may mitigate damage to one or more material layers within pSTTM 599 inflicted during manufacture (e.g., etching process utilized to form pSTTM device 599).

Figure 6:
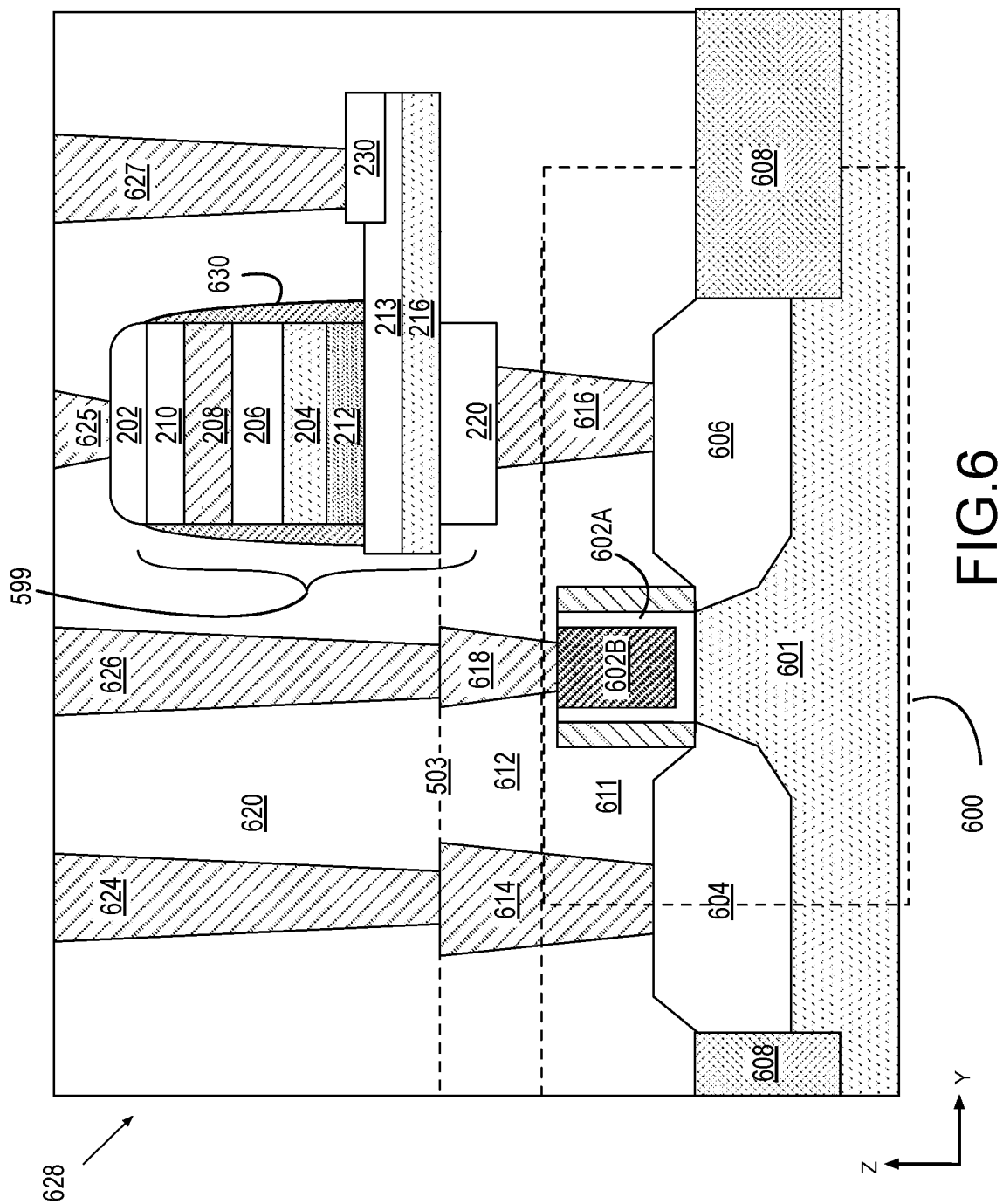
FIG. 6 illustrates a cross-sectional view of a multi-level STTM device on a conductive interconnect coupled to a transistor; in accordance with some embodiments.

FIG. 6 illustrates a MRAM cell 628 including multi-level pSTTM device 599 coupled to an access transistor 600. In an embodiment, pSTTM device 599 is as described above in association with FIG. 4C, or as described above in association with multi-level pSTTM device 201 (e.g., FIG. FIG. 2A). As shown in FIG. 6, pSTTM device 599 is coupled to transistor 600 through a conductive interconnect that includes a drain contact 616. Drain contact 616 is coupled with a drain region 606 of access transistor 600. Multi-level pSTTM device 599 includes electrode 202, electrode 220, free magnet 204 between electrodes 202 and 220, fixed magnet 208 between electrodes 202 and 220, tunnel barrier 206 between free magnet 204 and fixed magnet 208, a spacer layer 210 between free magnet 204 and electrode 202. Multi-level pSTTM device 599 further includes a booster between fixed magnet 208 and electrode 220. The booster further includes magnetic layer 213 coupled to free magnet 204 through coupling layer 212, and interface layer 216, for example substantially as described elsewhere herein. Multi-level pSTTM device 599 further includes a booster-programming electrode 230, for example substantially as described elsewhere herein. In an exemplary embodiment, pSTTM device 599 is surrounded by a dielectric spacer 630. In the illustrative embodiment, a memory contact 625 is coupled to the pSTTM device 599.

In an embodiment, an underlying substrate 601 comprises manufactured integrated circuits. Substrate 601 may include a material such as single crystal silicon, polycrystalline silicon and silicon on insulator (SOI), as well as substrates formed of other semiconductor materials. Substrate 601 may also include semiconductor materials, metals, dielectrics, dopants, and other materials commonly found in semiconductor substrates.

In some embodiments, access transistor 600 is a metal-oxide-semiconductor field-effect transistor (MOSFET). In some embodiments, access transistor 600 is a planar transistor or a nonplanar transistor. Nonplanar transistors include FinFET transistors such as double-gate transistors, tri-gate transistors, and wrap-around or "all-around gate" transistors (e.g., nanoribbon and nanowire transistors).

In an embodiment, access transistor 600 includes a gate stack including at least a gate dielectric layer 602A and a gate electrode 602B. Gate dielectric layer 602A may include one layer or a stack of layers. The one or more layers may include silicon oxide, silicon dioxide ($SiO_2$) and/or a high-k dielectric material (e.g., having a relative permittivity of at least 9). The high-k dielectric material may include one or more elements, such as hafnium, silicon, oxygen, titanium, tantalum, lanthanum, aluminum, zirconium, barium, strontium, yttrium, lead, scandium, niobium, and zinc. Exemplary high-k materials that may be used in the gate dielectric layer may further include oxygen with resulting compounds including, but not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Gate electrode 602B is over (e.g., on) the gate dielectric layer 602A and may consist of at least one P-type workfunction metal or N-type workfunction metal, depending on whether the transistor is to be a PMOS or an NMOS transistor. In some implementations, gate electrode 602B may comprise of a stack of two or more metal layers, where one or more metal layers are workfunction metal layers and at least one metal layer is a conductive fill layer. For a PMOS transistor, metals that may be used for gate electrode 602B include, but are not limited to, ruthenium, palladium, platinum, cobalt, nickel, and conductive metal oxides, e.g., ruthenium oxide. A P-type metal layer can serve as a PMOS gate electrode with a workfunction that is between about 4.9 eV and about 5.2 eV, for example. For an NMOS transistor, exemplary metals include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer can serve as an NMOS gate electrode with a workfunction that is between about 3.9 eV and about 4.2 eV, for example.

A source region 604 and drain region 606 may comprise impurity dopants such as boron, aluminum, antimony, phosphorous, or arsenic, for example. An annealing process make electrically activate these dopants. An epitaxial deposition process may also be performed to fabricate source region 604 and drain region 606. In some implementations, source region 604 and drain region 606 may comprise a silicon alloy such as silicon germanium or silicon carbide. In further embodiments, source region 604 and drain region 606 may comprise one or more alternate semiconductor materials such as germanium or a group III-V material. In the illustrative embodiment, an isolation dielectric 608 is adjacent to source region 604, drain region 606 and over portions of the substrate 601.

A source contact 614 and a drain contact 616 extend at least partially through a dielectric layer 611 and into a dielectric layer 612 above gate electrode 602B. In the illustrative embodiment, a source metallization structure 624 is coupled with source contact 614 and a gate metallization structure 626 is coupled with gate contact 618. In the illustrated embodiment, a dielectric layer 612 is adjacent to gate contact 618, drain contact 616, source contact 614, and portions of source metallization structure 624 and/or gate metallization structure 626.

In some embodiments, source contact 614, the drain contact 616 and gate contact 618 each includes a multi-layer stack. In some such embodiments, the multi-layer stack includes two or more distinct layers of metal such as a layer of Ti, Ru or Al and a conductive cap on the layer of metal. The conductive cap may include a material such as W or Cu.

A dielectric layer 620 is adjacent to the dielectric spacer 630, and a portion of electrode 220. Dielectric layer 620 is also adjacent to portions of the source metallization structure 624, gate metallization structure 626, and memory contact 625. Isolation dielectric 608, dielectric layers 612, 611, 503 and 620 may include any material that has sufficient dielectric strength to provide electrical isolation such as, but not limited to, silicon dioxide, silicon nitride, silicon oxynitride, carbon doped nitride, or carbon doped oxide.

Figure 7:
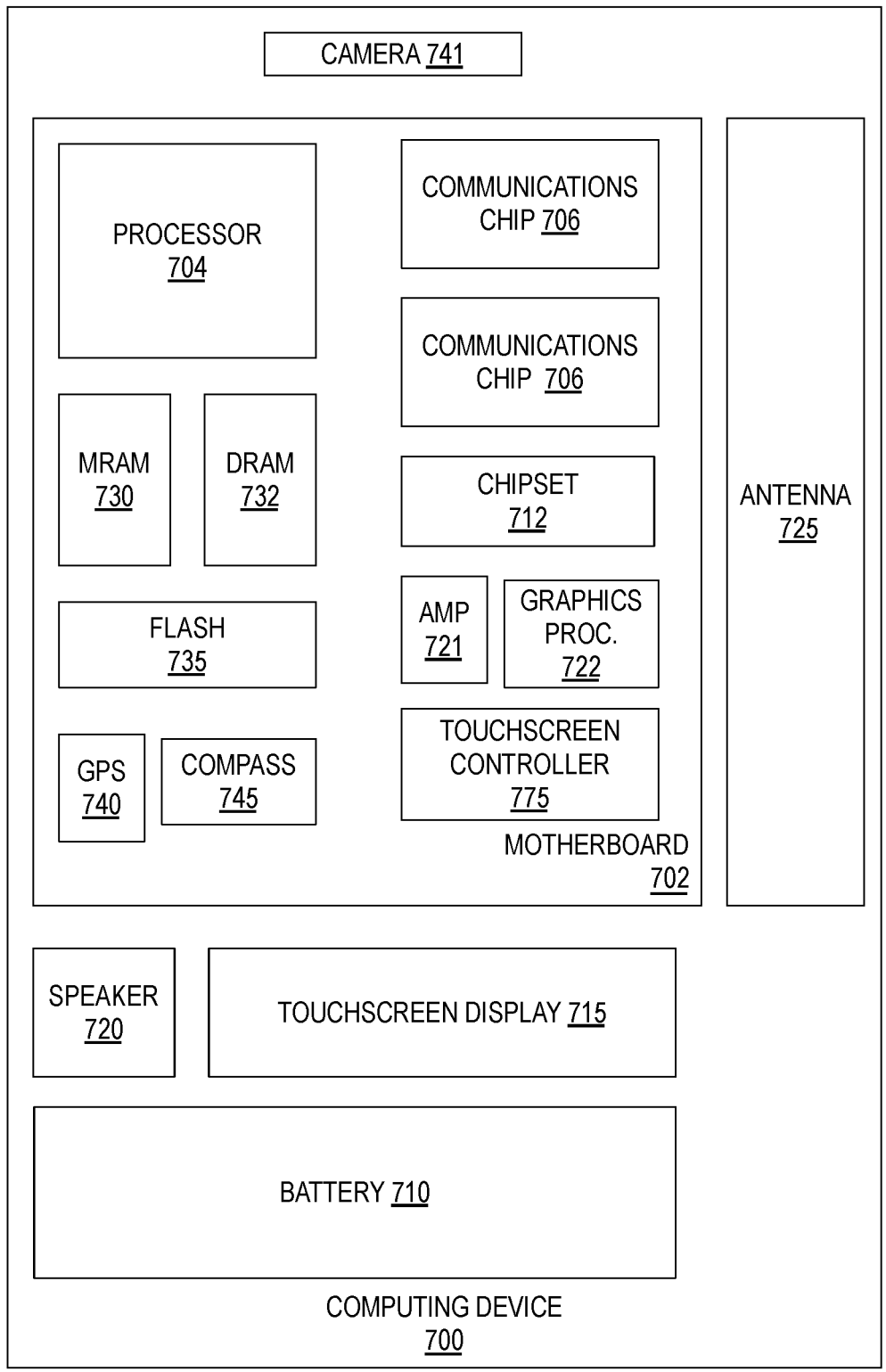
FIG. 7 illustrates a computing device, in accordance with some embodiments.

FIG. 7 illustrates a computing device 700 in accordance with embodiments of the present disclosure. In various implementations, computing device 700 may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

As shown, computing device 700 houses a motherboard 702. Motherboard 702 may include a number of components, including but not limited to a processor 704 and at least one communication chip 706. Processor 704 is physically and electrically coupled to the motherboard 702. In some implementations, communication chip 706 is also physically and electrically coupled to motherboard 702. In further implementations, communication chip 706 is part of processor 704.

Depending on its applications, computing device 700 may include other components that may or may not be physically and electrically coupled to motherboard 702. These other components include, but are not limited to, volatile memory (e.g., DRAM 732), non-volatile memory (e.g., MRAM 730), or flash memory 735. In some embodiments, MRAM 730 includes transistor 600 (FIG. 6) coupled with one at least one pSTTM memory device such as a pSTTM memory device 201 (FIG. 2A), multi-level pSTTM device 599 (FIG. 5), for example as described elsewhere herein. Computing device 700 may further include one or more of a graphics processor 722, a digital signal processor, a crypto processor, a chipset 712, an antenna 725, a display 715, a battery 710, an audio codec, a video codec, a power amplifier 721, a global positioning system (GPS) device 740, a compass 745, an accelerometer, a gyroscope, a speaker 720, a camera 741, and a mass storage device (such as hard disk drive, compact disk (CD), digital versatile disk (DVD), or the like.

Communication chip 706 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 706 may implement any of a number of wireless standards or protocols, including but not limited to Wi-Fi (IEEE 802.11 family), WiMAX (IEEE 802.11 family), IEEE 802.10, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

Processor 704 of the computing device 700 includes an integrated circuit die packaged within processor 704. In some embodiments, the integrated circuit die of processor 704 or packaged processor includes embedded memory further including a transistor 600 coupled with one at least one multi-level pSTTM memory device such as pSTTM device 201, pSTTM device 599, for example as described elsewhere herein. The term "processor" may refer to any device or portion of a device that processes electronic data from registers and/or memory to transform that electronic data into other electronic data that may be stored in registers and/or memory.

Communication chip 706 may also include an integrated circuit die that includes embedded memory further including a memory array with memory cells including pSTTM device 201 and/or 599.

Figure 8:
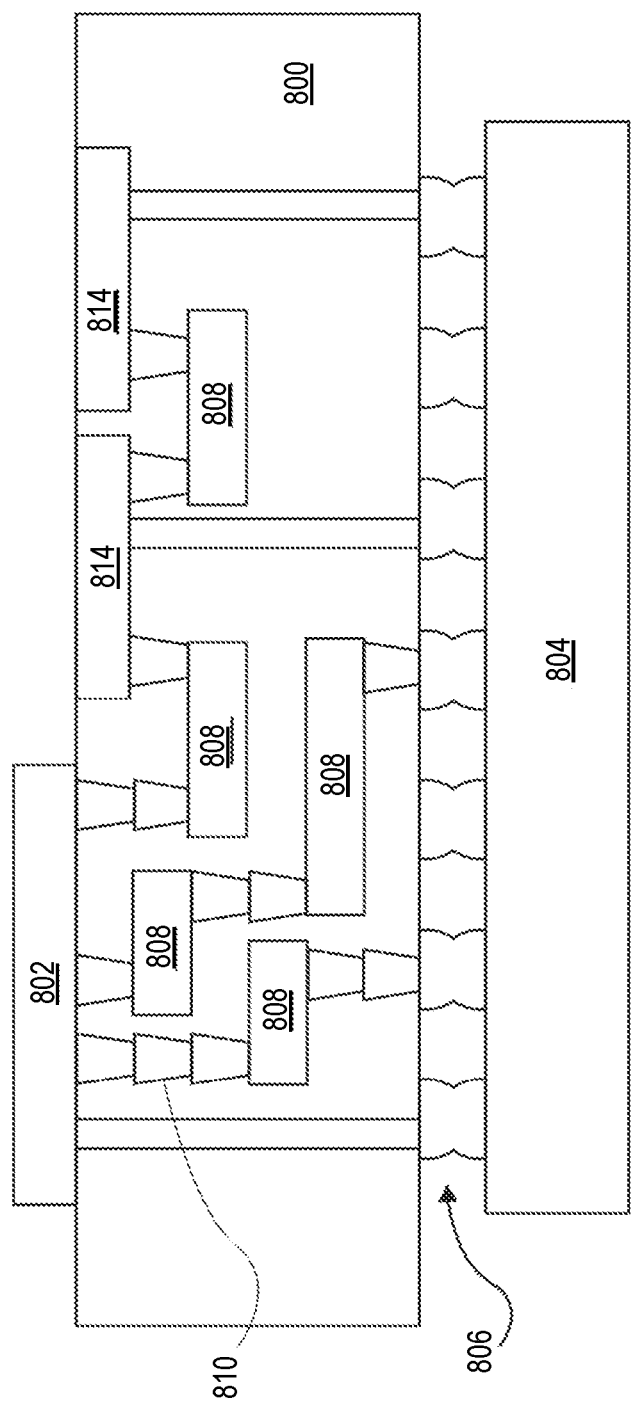
FIG. 8 illustrates an integrated circuit structure that includes one or more embodiments of an STTM device with a skyrmion SAF structure.

FIG. 8 illustrates an integrated circuit structure 800 that includes one or more exemplary embodiments. The integrated circuit (IC) structure 800 is an intervening structure used to bridge a first substrate 802 to a second substrate 804. The first substrate 802 may be, for instance, an integrated circuit die. The second substrate 804 may be, for instance, a memory module, a computer motherboard, or another integrated circuit die. The integrated circuit die may include one or more device systems such as a device structure including a transistor 600 coupled with at least one pSTTM memory device such as a pSTTM device 201, or pSTTM device 599, for example.

Generally, integrated circuit (IC) structure 800 is to spread electrical connections to a wider pitch than that on substrate 802, and/or to reroute a connection to a different connection. For example, IC structure 800 may couple an integrated circuit die to a ball grid array (BGA) 806 that can subsequently be coupled to the second substrate 804. In some embodiments, the first and second substrates 802/804 are attached to opposing sides of IC structure 800. In other embodiments, the first and second substrates 802/804 are attached to the same side of IC structure 800. And in further embodiments, three or more substrates are interconnected by way of IC structure 800.

IC structure 800 may be formed of an epoxy resin, a fiberglass-reinforced epoxy resin, a ceramic material, or a polymer material such as polyimide. In further implementations, IC structure 800 may be formed of alternate rigid or flexible materials that may include the same materials described above for use in a semiconductor substrate, such as silicon, germanium, or other group III-N, group III-V and group IV materials. IC structure 800 may include metal interconnects 808 and via 810, including but not limited to through-silicon vias (TSVs). IC structure 800 may further include embedded devices 814, including both passive and active devices. Such devices include, but are not limited to, capacitors, decoupling capacitors, resistors, inductors, fuses, diodes, transformers, a transistor 600 coupled with a with one at least one pSTTM memory device such as a pSTTM device 201, or pSTTM device 599, for example. More complex devices such as radio-frequency (RF) devices, power amplifiers, power management devices, antennas, arrays, sensors, and MEMS devices may also be formed on IC structure 800.

As used in any embodiment described herein, the term "module" refers to any combination of software, firmware and/or hardware configured to provide the functionality described herein. The software may be embodied as a software package, code and/or instruction set or instructions, and "hardware", as used in any implementation described herein, may include, for example, singly or in any combination, hardwired circuitry, programmable circuitry, state machine circuitry, and/or firmware that stores instructions executed by programmable circuitry. The modules may, collectively or individually, be embodied as circuitry that forms part of a larger system, for example, an integrated circuit (IC), system on-chip (SoC), and so forth.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

While specific embodiments are described herein with respect to pSTTM devices. It is to be appreciated that embodiments described herein may also be applicable to other non-magnetic random access memory (MRAM) devices, such as, but not limited to, in plane or perpendicular spin orbit torque (SOT) memory devices. Hence, various modifications of the implementations described herein, as well as other implementations, which are apparent to persons skilled in the art to which the present disclosure pertains are deemed to lie within the spirit and scope of the present disclosure.

In first examples, a memory device comprises a first electrode, a second electrode, a fixed magnet between the first electrode and the second electrode, a free magnet between the first electrode and the second electrode, a tunnel barrier between the fixed magnet and the free magnet, a booster between the free magnet and the second electrode, wherein the booster comprises a magnetic skyrmion or ferromagnetic domain, and a third electrode in electrical contact with the booster, the third electrode to conduct a current through the booster that displaces the magnetic skyrmion or ferromagnetic domain relative to the free magnet.

In second examples, for any of the first examples the free magnet has a first in-plane length along a first dimension, and the booster comprises a magnetic material layer having a second in-plane length along the first dimension that is greater than the first in-plane length, and that is greater than twice a radius of the magnetic skyrmion.

In third examples, for any of the first through second examples an average magnetic anisotropy of the magnetic skyrmion varies between perpendicular and in-plane over the radius of the skyrmion.

In fourth examples, for any of the second through third examples the second in-plane length is greater than four times the radius of the skyrmion.

In fifth examples, for any of the second through fourth examples an electrical resistance between the first and second electrodes is at a first level when a core of the magnetic skyrmion is at a position along the second in-plane length that is between the free magnet and the second electrode. The electrical resistance between the first and second electrodes is at a second level when the core of the magnetic skyrmion is at a position along the second in-plane length that is beyond an edge of the free magnet.

In sixth examples, for any of the fifth examples the electrical resistance between the first and second electrodes is at the first level when magnetizations of the free magnet and fixed magnet have a first relative orientation. The electrical resistance between the first and second electrodes is at a third level when the core of the magnetic skyrmion is at a position along the second in-plane length that is between the free magnet and the second electrode and magnetizations of the free magnet and fixed magnet have a second relative orientation. The electrical resistance between the first and second electrodes is at the second level when magnetizations of the free magnet and fixed magnet have the first relative orientation. The electrical resistance between the first and second electrodes is at a fourth level when the core of the magnetic skyrmion is at a position along the second in-plane length that is beyond an edge of the free magnet and the magnetizations of the free magnet and fixed magnet have the second relative orientation.

In seventh examples, for any of the second through the sixth examples the booster further comprises an interface layer between the magnetic material layer and at least one of the free magnet and the second electrode, and the interface layer has an in-plane length along the first dimension that is substantially equal to the second in-plane length.

In eighth examples, for any of the seventh examples, the interface layer comprises at least one of silicon, aluminum, platinum, iridium, tungsten, tantalum, or ruthenium.

In ninth examples, for any of the eighth examples the magnetic material layer comprises iron, the interface layer comprises at least one of iridium, tungsten, or ruthenium, and the interface layer is between the magnetic material layer and the second electrode.

In tenth examples, for any of the second through the ninth examples, the magnetic material layer has a thickness between 2 nm-3 nm, the interface layer has a thickness less than 2 nm, the free magnet and the fixed magnet comprise cobalt, boron and iron, the tunnel barrier comprises magnesium and oxygen, and the memory device further comprises a synthetic antiferromagnet (SAF) structure between the fixed magnet and the first electrode.

In eleventh examples, for any of the first through the tenth examples the magnetic material layer comprises cobalt, boron, and iron.

In twelfth examples, an apparatus comprises first circuitry to switch a magnetization direction of a free magnet in a magnetic tunneling junction (MTJ) device by driving a first electrical current between a first and second electrode of the MTJ device. The apparatus comprises second circuitry to induce translation of a magnetic skyrmion or ferromagnetic domain within a length of a magnetic material in the MTJ device by driving a second electrical current between the second electrode and a third electrode of the MTJ device coupled to the booster.

In thirteenth examples, for any of the twelfth examples the magnetic skyrmion is to be translated toward the free magnet in response to an electrical current driven through the magnetic material in a first direction between the second and third electrodes, and the magnetic skyrmion is to be translated away from the free magnet in response to an electrical current driven through the magnetic material in a second direction, opposite the first, between the second and third electrodes.

In fourteenth examples, for any of the twelfth through thirteenth examples the apparatus comprises third circuitry to detect one of a plurality of resistance states of the MTJ device, wherein the resistance states are associated with an orientation of magnetization of the free magnet relative to a fixed magnet of the MTJ device, and are further associated with a position of the magnetic skyrmion within the magnetic material relative to the free magnet of the MTJ device.

In fifteenth examples, a method of operating a memory device comprises switching a magnetization direction of a free magnet in a magnetic tunneling junction (MTJ) device by driving a first electrical current between a first and second electrode of the MTJ device, and translating a magnetic skyrmion over a length of a magnetic material of the MTJ device by driving a second electrical current between the second electrode and a third electrode of the MTJ device coupled to the magnetic material.

In sixteenth examples, for any of the fifteenth examples the method further comprises translating the magnetic skyrmion toward the free magnet with an electrical current driven in a first direction between the second and third electrodes, and translating the magnetic skyrmion away from the free magnet with an electrical current driven in a second direction, opposite the first, between the second and third electrodes.

In seventeenth examples, for any of the fifteenth through the sixteenth examples the method further comprise detecting one of a plurality of resistance states of the MTJ device, wherein the resistance states are associated with an orientation of magnetization of the free magnet relative to a fixed magnet of the MTJ device, and a position of the magnetic skyrmion within the magnetic material relative to the free magnet of the MTJ device.

In eighteenth examples, a method of fabricating a memory device comprises forming a first electrode, fabricating a booster coupled to the first electrode, the booster comprising a magnetic layer and an interface layer, forming an MTJ stack coupled to the booster, and forming a third electrode coupled to the booster. The forming of the MTJ stack further comprises depositing a free magnet layer above the booster, depositing a tunnel barrier layer over the free magnet layer, depositing a fixed magnet layer over the tunnel barrier layer, depositing a spacer layer over the fixed magnet layer, forming a second electrode coupled to the spacer layer, and forming a third electrode coupled to the booster.

In nineteenth examples, for any of the eighteenth examples the booster comprises a magnetic skyrmion or ferromagnetic domain, and the third electrode is to conduct a current through the booster that displaces the magnetic skyrmion or ferromagnetic domain relative to the free magnet.

In twentieth examples, fabricating the booster further comprises patterning the magnetic layer and the interface layer to have a first lateral length that is longer than a second lateral length of the MTJ stack by an amount at least equal to a lateral length of a magnetic skyrmion or ferromagnetic domain within the magnetic material.

It will be recognized that principles of the disclosure are not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:
1. A memory device, comprising:
a first electrode;
a second electrode;
a fixed magnet between the first electrode and the second electrode;

a free magnet between the first electrode and the second electrode, wherein the free magnet has a first in-plane length along a first dimension;

a tunnel barrier between the fixed magnet and the free magnet;

a magnetic material layer between the free magnet and the second electrode, wherein the magnetic material layer has a second in-plane length along the first dimension that is greater than the first in-plane length; and a third electrode in electrical contact with the magnetic material layer, the third electrode to induce a translation of a magnetic skyrmion or ferromagnetic domain within the magnetic material layer over at least a portion of the second in-plane length, altering a proximity of the magnetic skyrmion or ferromagnetic domain to the first in-plane length of the free magnet.

2. The memory device of claim 1, wherein an average magnetic anisotropy of the magnetic skyrmion varies between perpendicular and in-plane over a radius of the skyrmion.

3. The memory device of claim 1, wherein:
the third electrode is to conduct a current through the magnetic material layer that induces the translation of the magnetic skyrmion or ferromagnetic domain; and
the second in-plane length is greater than a radius of the skyrmion or ferromagnetic domain.

4. The memory device of claim 1, wherein:
an electrical resistance between the first and second electrodes is at a first level when the magnetic skyrmion or magnetic domain is at a first position along the second in-plane length that is between the free magnet and the second electrode; and
the electrical resistance between the first and second electrodes is at a second level when the magnetic skyrmion or magnetic domain is at a second position along the second in-plane length that is beyond the first in-plane length.

5. The memory device of claim 4, wherein:
the electrical resistance between the first and second electrodes is at the first level when magnetizations of the free magnet and fixed magnet have a first relative orientation;
the electrical resistance between the first and second electrodes is at a third level when the magnetic skyrmion or magnetic domain is at the first position and magnetizations of the free magnet and fixed magnet have a second relative orientation;
the electrical resistance between the first and second electrodes is at the second level when magnetizations of the free magnet and fixed magnet have the first relative orientation; and
the electrical resistance between the first and second electrodes is at a fourth level when the magnetic skyrmion or magnetic domain is at the second position and the magnetizations of the free magnet and fixed magnet have the second relative orientation.

6. The memory device of claim 1, further comprising an interface layer between the magnetic material layer and at least one of the free magnet and the second electrode, and the interface layer has an in-plane length along the first dimension that is substantially equal to the second in-plane length.

7. The memory device of claim 6, wherein the interface layer comprises at least one of silicon, aluminum, platinum, iridium, tungsten, tantalum, or ruthenium.

8. The memory device of claim 6, wherein the magnetic material layer comprises iron, the interface layer comprises at least one of iridium, tungsten, or ruthenium, and the interface layer is between the magnetic material layer and the second electrode.

9. The memory device of claim 1, wherein:
the magnetic material layer has a thickness between 2 nm-3 nm;
the interface layer has a thickness less than 2 nm;
the free magnet and the fixed magnet comprise cobalt, boron and iron;
the tunnel barrier comprises magnesium and oxygen; and
the memory device further comprises a synthetic antiferromagnet (SAF) structure between the fixed magnet and the first electrode.

10. The memory device of claim 9, wherein the magnetic material layer comprises cobalt, boron, and iron.

11. An apparatus comprising:
first circuitry to switch a magnetization direction of a free magnet in a magnetic tunneling junction (MTJ) device by driving a first electrical current between a first and second electrode of the MTJ device;
second circuitry to induce a first translation of a magnetic skyrmion or ferromagnetic domain within a magnetic material layer in the MTJ device toward the free magnet by driving a second electrical current between the first or second electrode and a third electrode of the MTJ device coupled to the magnetic material layer, and to induce a second translation of a magnetic skyrmion or ferromagnetic domain within the magnetic material layer away from the free magnet by driving a third electrical current between the first or second electrode and the third electrode; and
third circuitry to detect one of a plurality of resistance states associated with a position of the magnetic skyrmion within the magnetic material relative to the free magnet.

12. The apparatus of claim 11, wherein:
the second electrical current is in a first direction; and
the third electrical current is in a second direction, opposite the first.

13. The apparatus of claim 11, further comprising:
wherein the resistance states are further associated with an orientation of magnetization of the free magnet relative to a fixed magnet of the MTJ device.

14. A method of operating a memory device, the method comprising:
switching a magnetization direction of a free magnet in a magnetic tunneling junction (MTJ) device by driving a first electrical current between a first and second electrode of the MTJ device;
translating a magnetic skyrmion or magnetic domain over a length of a magnetic material of the MTJ device toward the free magnet with a second electrical current driven in a first direction between a third electrode coupled with the magnetic material and the first or second electrode;
translating the magnetic skyrmion or magnetic domain over the length of the magnetic material away from the free magnet with a third electrical current driven in a second direction, opposite the first direction, between the third electrode and the first or second electrode; and
detecting one of a plurality of resistance states of the memory device, wherein the resistance states are associated with an orientation of magnetization of the free magnet and a position of the magnetic skyrmion or magnetic domain within the magnetic material layer.

15. The method of claim 14,
wherein the second electrical current is driven through the magnetic material layer in the first direction between the second and third electrodes; and
wherein the third electrical current is driven through the magnetic material layer in the second direction between the second and third electrodes.

16. A method of fabricating a memory device, the method comprising:
forming a first electrode;
fabricating a booster coupled to the first electrode, the booster comprising a magnetic material layer and an interface layer;
forming an MTJ stack coupled to the booster, the forming comprising:
depositing a free magnet layer above the booster;
depositing a tunnel barrier layer over the free magnet layer;
depositing a fixed magnet layer over the tunnel barrier layer;
depositing a spacer layer over the fixed magnet layer;
forming a second electrode coupled to the spacer layer; and
forming a third electrode coupled to the booster, wherein fabricating the booster further comprises patterning the magnetic material layer and the interface layer to have a first lateral length that is longer than a second lateral length of the MTJ stack by an amount at least equal to a lateral length of a magnetic skyrmion or ferromagnetic domain that is to be translated within the magnetic material over the first lateral length in response to an electrical current passed through the third electrode.

17. The method of claim 16, wherein the third electrode is to conduct a current through the booster that displaces the magnetic skyrmion or ferromagnetic domain relative to the free magnet.

18. The method of claim 16, wherein the first lateral length is longer than the second lateral length by an amount at least equal to a lateral length of the magnetic skyrmion or ferromagnetic domain.

* * * * *